United States Patent [19]

Darrow et al.

[11] 4,150,417
[45] Apr. 17, 1979

[54] FAIL-SAFE TIMING CIRCUIT

[75] Inventors: John O. G. Darrow, Murrysville; William R. Popp, Allison Park, both of Pa.

[73] Assignee: Westinghouse Air Brake Company, Swissvale, Pa.

[21] Appl. No.: 919,093

[22] Filed: Jun. 26, 1978

[51] Int. Cl.² .................. B61L 1/08; B61L 21/00; B61L 21/06; H03K 5/153
[52] U.S. Cl. .................................. 361/198; 307/293; 361/203
[58] Field of Search ............ 307/141, 293; 246/63 R, 246/63 A, 63 C; 361/196, 197, 198, 203

[56] References Cited

U.S. PATENT DOCUMENTS 3,955,125   5/1976   Butler et al. .................. 307/293 X Primary Examiner—L. T. Hix
Assistant Examiner—James Dwyer
Attorney, Agent, or Firm—R. W. McIntire, Jr.

[57] ABSTRACT

This disclosure relates to a fail-safe timing circuit having a regulator which produces a regulated d.c. voltage when a switch is closed. A signal generator powered by the regulated d.c. voltage for producing square-wave signals. A two-stage amplifier for amplifying the square-wave signals which are fed to a dual rectifier network which produces a positive d.c. voltage and a regulated negative fail-safe d.c. voltage. A pulse generator powered by the positive d.c. voltage for producing signal pulses having an unequal duty cycle. A charging circuit connected to the regulated negative d.c. voltage, and a trigger circuit for periodically sampling the potential charge on the charging circuit. An amplifier for amplifying periodic pulses which are produced during the sampling of the potential charge. A level detector for producing a.c. oscillations when the level of the periodic pulses exceeds a predetermined value, an amplifier for amplifying the a.c. oscillations, and a rectifier for rectifying the amplified a.c. oscillations to produce a d.c. output voltage for energizing a relay upon expiration of a given time interval after the switch is closed.

15 Claims, 2 Drawing Figures

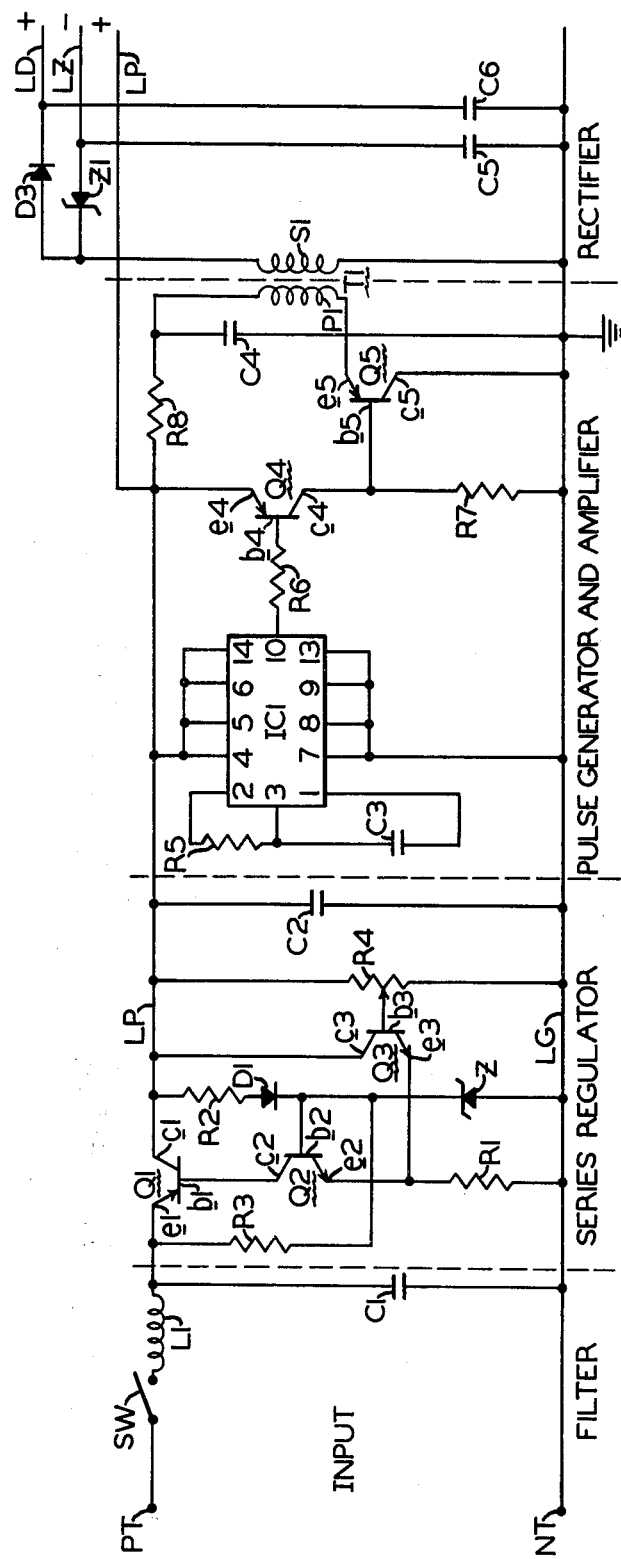

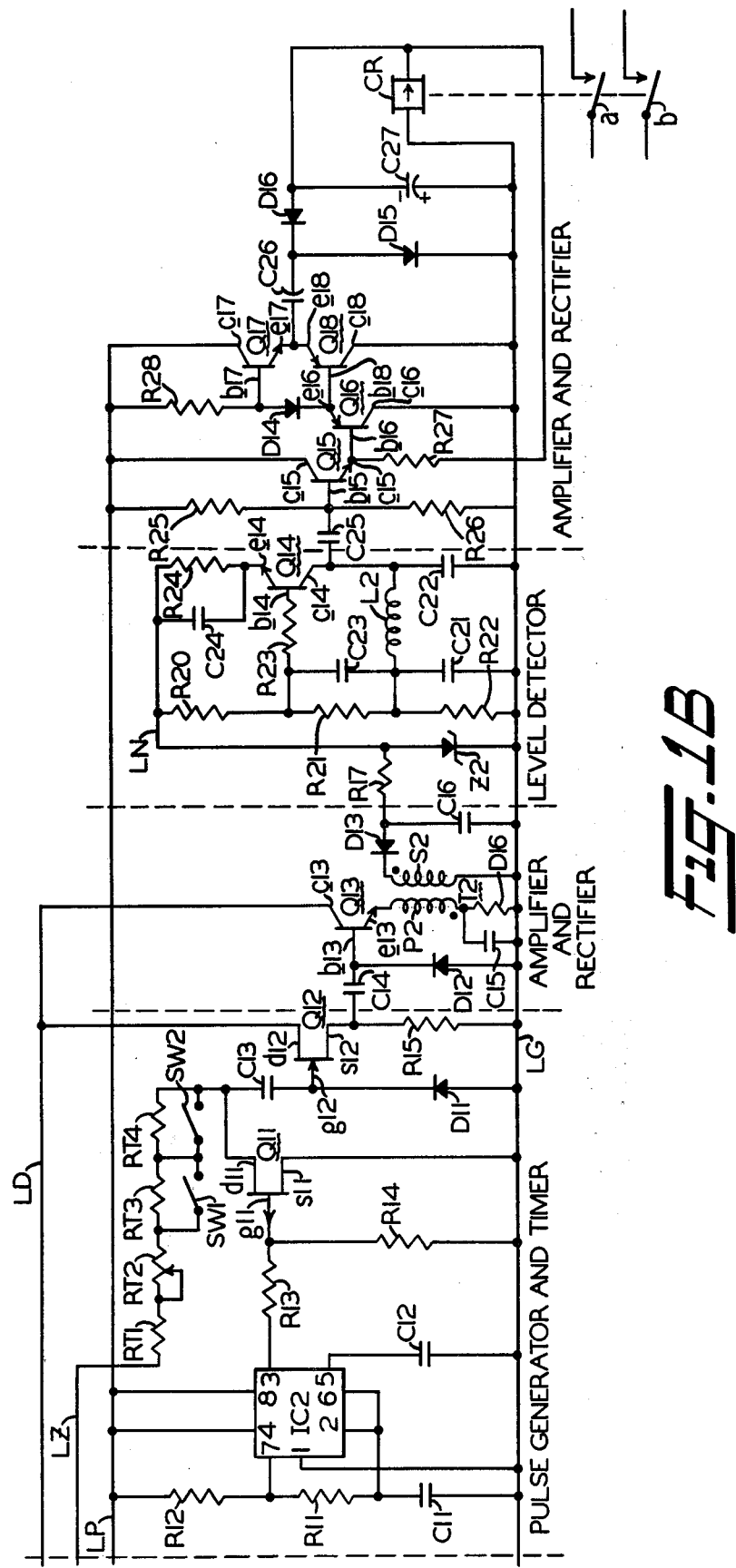

FAIL-SAFE TIMING CIRCUIT

FIELD OF THE INVENTION

This invention relates to a fail-safe time element relay and more particularly to a vital solid-state timing circuit operating on an a.c. coupled signal principle which ensures that an electromagnetic relay is not susceptible to a false and unsafe pickup due to a component or circuit failure or due to the presence of voltage surges or transients.

BACKGROUND OF THE INVENTION

In previous types of electronic time element relays, it was common practice to employ an energy storage principle to provide and establish a lapsed time period. In certain railway and mass and/or rapid transit systems, such as, in automatic train operations, it is necessary to establish minimal headways or time intervals between trains in order to provide fast and efficient service. When a train enters a block or track section, it is essential that the signal at the exit end should not be cleared immediately so that the train may proceed into the next block or track section. In the interest of safety, it is required that some predetermined time delay be employed in switching the speed signal so that the train can be safely stopped or can proceed within the track section at a safe reduced headway speed which is established by the signal aspect at the exit end of the block. It will be appreciated that under no circumstance should the length of the time delay be capable of being reduced since the restrictive speed signal at the exit end of the block would be cleared too soon so that the trailing train could come too close to the train ahead. Thus, an unsafe condition would exist since the distance between trains would be insufficient for allowing the trailing train to stop in time in case an emergency occurs and requires the application of an emergency stopping of the preceding train. Accordingly, it is mandatory in a fail-safe train operation, to ensure that the time delay period must not be shortened since a dangerous condition would prevail and could result in a catastrophic collision. It will also be appreciated that if energy is removed thereby, indicating a cancellation of the time period, that the timing device shall be safely guaranteed to reset to zero (0).

OBJECTS OF THE INVENTION

Accordingly, it is an object of this invention to provide an improved fail-safe solid-state time element relay which operates on an a.c. coupling principle.

Another object of this invention is to provide a unique vital timing circuit employing a sampler for periodically evaluating the energy of a storage device.

A further object of this invention is to provide a fail-safe time delay circuit in which any failure is incapable of reducing the length of the time delay period.

Yet another object of this invention is to provide a new and improved time element relay which operates in a fail-safe manner.

Yet a further object of this invention is to provide a fail-safe transistorized timing circuit having a time delay interval which is not adversely affected by voltage surges and transients.

Still another object of this invention is to provide a vital solid-state time element circuit employing an a.c. operating principle to ensure that the duration of a time delay period is not unsafely shortened by a component or circuit failure.

Still a further object of the invention is to provide a vital transistorized timing circuit which periodically samples the energy charge on a capacitor of an R-C circuit for establishing a fixed period of time.

An additional object of this invention is to provide a fail-safe time element relay having a switching means for selectively connecting a source of d.c. voltage to a voltage regulating means, the voltage regulating means supplying regulated voltage to a signal generating means, the signal generating means producing a.c. signals which are fed to an amplifying means, the amplifying means supplying amplified a.c. signals to a rectifying means, the rectifying means rectifying the amplified a.c. signals into a first and a second d.c. voltage, a pulse generating means for supplying signal pulses to a triggering means, the fist d.c. voltage connected to a timing circuit for storing a charge, the second d.c. voltage supplying operating potential to an amplifier, the triggering means sampling the amount of stored charge and causing the amplifier to produce amplified pulses, a rectifier for rectifying the amplified pulses and causing an oscillating level detecting means to produce a.c. oscillations when the amplified rectified pulses reach a predetermined level, an output amplifying means for amplifying the a.c. oscillations, a voltage doubler for rectifying the amplified a.c. oscillations and for energizing an output device a predetermined time after the switching means connects the voltage regulating means to the source of d.c. voltage.

Still an additional object of this invention is to provide a switch, a regulator for producing a source of regulated d.c. voltage when the switch is closed, a signal generator powered by the regulated d.c. voltage for producing a.c. signals which are amplified and are fed to a rectifier which provides a first polarity of regulated d.c. voltage and a second polarity of unregulated d.c. voltage, a pulse generator powered by the first polarity of regulated d.c. voltage for producing signal pulses having an unequal duty cycle, a charging circuit coupled to the first polarity of regulated d.c. voltage being periodically sampled by a trigger circuit, an amplifier coupled to the charging circuit for amplifying periodic pulses which are produced during the sampling of the charging circuit, a rectifier for rectifying the periodic pulses, a level detector for producing a.c. oscillations when the level of the rectified periodic pulses exceeds a predetermined value, an amplifier for amplifying the a.c. oscillations, and a rectifier for rectifying the amplified a.c. oscillations to produce a d.c. output voltage for energizing a relay upon expiration of a given time interval after the switch is closed.

Yet an additional object of this invention is to provide an improved fail-safe solid-state time element relay circuit which is economical in construction, reliable in operation, efficient in service, durable in use and simple in design.

SUMMARY OF THE INVENTION

In the attainment of the foregoing objects, there is provided a fail-safe transistorized time delay relay circuit which will not be prematurely picked up during the presence of transients and surge voltages. The time delay relay circuit includes a control switch for selectively connecting a source of d.c. operating voltage to a transistorized series voltage regulator. The low regulated output voltage from the series regulator powers an integrated circuit square-wave signal generator. The square-wave signals are amplified by a pair of cascaded PNP transistors and are transformer-coupled to a dual rectifier network. The dual rectifier network includes a first and a second half-wave rectifier for producing a first polarity of relatively high regulated d.c. voltage and a second polarity of unregulated d.c. voltage. An integrated circuit pulse generator which is powered by the low regulated output voltage produces signal pulses having an unequal duty cycle. A timing circuit including a plurality of resistors and a serially connected charging capacitor coupled to the first polarity of regulated d.c. voltage. The signal pulses periodically trigger a P-channel field effect switching transistor to sample the potential energy on the charging capacitor. A multistage amplifier including a source-follower N-channel field effect transistor and an emitter-follower NPN transistor amplifies the sampled potential pulses which are transformer-coupled to a peak rectifying circuit. The rectified pulse voltage of the peak rectifier is connected to the d.c. supply of an oscillating type of transistorized level detector. When the level of the rectified pulse voltage is sufficient, the transistorized level detector is rendered conductive and produces a.c. oscillations which are amplified by a solid-state output power amplifier. The power amplifier is coupled to a voltage doubling network which causes the energization of the coil of a vital type of electro-magnetic relay for picking up and closing the front contacts a predetermined time after the closing of the control switch.

DESCRIPTION OF THE DRAWINGS

The foregoing objects and other attendant features and advantages will become more readily understood and appreciated as the subject invention is described in further detail and is considered in conjunction with the accompanying drawings, wherein:

FIGS. 1A and 1B, when arranged end to end with FIG. 1A situated on the left, illustrate a schematic circuit diagram of the fail-safe time delay relay circuit embodying the present invention.

DETAILED DESCRIPTION OF THE INVENTION

Referring now to the drawings, namely, FIGS. 1A and 1B, there is shown a vital type of time delay circuit or fail-safe time element relay which provides for the picking up of a relay after the expiration of a set period of time. As shown in FIG. 1A, a suitable source of direct current supply voltage, such as, a battery or a d.c. power supply (now shown) is connected to the positive terminal PT and negative terminal NT. It will be seen that the d.c. voltage source is selectively connected to the time delay relay circuit by a controllable contact switch SW. Thus, the switch SW will control the application of d.c. voltage to the various components and element of the timing circuit which will be described in detail hereinafter. In practice, the open switch SW may be closed by a train entering the block or track section which also causes the track relay to be deenergized due to the shunting of the rails by the wheels and associated axles. As shown, the movable contact of switch SW is connected to positive terminal PT while the fixed contact is connected to one end of a choke coil or inductor L1 which forms a filter network with capacitor C1. It will be seen that the upper plate of smoothing capacitor C1 is connected to the other end of inductor L while the lower plate of capacitor C1 is connected to ground lead LG.

It will be noted that a series voltage regulator which is connected to the filter network supplies operating voltage thereto. The voltage regulator includes a series regulating PNP transistor Q1 having an emitter electrode e1, a collector electrode c1 and a base electrode b1. The emitter electrode e1 is connected to the junction point between inductor L1 and capacitor C1. The collector electrode C1 is connected to the positive output lead LP. The conductive condition of series transistor Q1 is controlled by a differential amplifier circuit which senses the output voltage of the regulator. The differential amplifier includes first and second NPN transistors Q2 and Q3. The amplifying transistor Q2 includes an emitter electrode e2, a collector electrode c2 and a base electrode b2 while the amplifying transistor Q3 includes an emitter electrode e3, a collector electrode c3 and a base electrode b3. The collector electrode c2 is directly connected to the base electrode b1 of transistor Q1 while the emitter electrode e2 is connected to ground lead LG via load resistor R1. The base electrode b2 is connected to a voltage divider including resistor R2, diode D1 and Zener diode Z. As shown, resistor R2 is connected between lead LP and the anode electrode of diode D1. The cathode electrode of diode D1 is connected to the cathode electrode of Zener diode Z while the anode electrode of Zener diode Z is connected to lead LG. The base electrode b2 is connected to the point common to the cathode electrodes of diodes D1 and Z, and the emitter electrode e1 of transistor Q1 is connected to the common cathode point via a biasing resistor R3. The base electrode b3 is connected to the movable tap or wiper contact of a potentiometer R4 which is connected between leads LP and LG. The collector electrode c3 is directly connected to lead LP while the emitter electrode e3 is connected to lead LG via load resistor R1. Finally, a capacitor C2 is connected across leads LP and LG of the regulator to act as a filter and to dampen any sudden load demand changes.

The output of the series regulator is coupled to a square-wave pulse generator which includes the integrated circuit IC1 having a commercial type of designation as CD4047 manufactured and sold by RCA. As shown, the terminals 1, 2 and 3 are interconnected via a timing circuit including R5 and capacitor C3. The lower plate of capacitor C3 is connected to terminal 1 while the upper plate is connected to the lower end of resistor R5 and, in turn, connected to terminal 3. The upper end of resistor R5 is connected to terminal 2 of the integrated circuit IC1. It will be seen that positive terminals 4, 5, 6 and 14 are connected in common and are connected to lead LP. Similarly, the negative terminals 7, 8, 9 and 13 are connected in common and are coupled to ground lead LG. The output from the integrated circuit pulse generator IC1 is derived from terminal 10 and is applied to the input of a two-stage amplifier including PNP transistors Q4 and Q5. As shown, the first common collector input transistor Q4 includes an emitter electrode e4, a collector electrode c4 and a base electrode b4 while the second output transistor Q5 includes an emitter electrode e5, a collector electrode c5 and a base electrode b5. The output terminal 10 is connected to the base electrode b4 via resistor R6 while the emitter electrode e4 is directly connected to positive lead LP. The collector electrode c4 is connected to ground lead LG via load resistor R7. The amplified output square-wave signals are taken from collector electrode c4 and are directly applied to base electrode b5. The collector electrode c5 is directly connected to ground while the emitter electrode e5 is coupled through primary winding P1 of transformer T1 and series resistor R8 to the lead LP. One end of a filtering capacitor C4 is connected to the junction point of the series connected resistor R8 and primary winding P1 while the other end of capacitor C4 is connected to ground lead LG. Thus, the square-wave signals developed across primary winding P1 are induced into the secondary winding S1 of transformer T1. The voltage developed across secondary winding S1 is supplied to a pair of half-wave rectifiers.

The first half-wave rectifier includes a voltage breakdown device, such as, a Zener diode Z1 and smoothing capacitor C5 for safely producing a negative regulated d.c. voltage on lead LZ. The second half-wave rectifier includes a diode D3 and a smoothing capacitor C6 for producing a positive d.c. voltage on lead LD.

The negative lead LZ supplies regulated voltage of opposite polarity to the relatively low positive d.c. voltage on lead LP to a timing circuit as will be presently described. Further, positive lead LD supplies operating voltage on the amplifier network as will be described in detail hereinafter. As shown, the positive d.c. voltage lead LP supplies operating potential to the other active circuits of FIG. 1B. For example, lead LP provides positive voltage to a pulse generator employing an integrated circuit oscillator IC2. The integrated circuit IC2 may be of the designated type MC1555 manufactured and sold by Motorola. A pair of series connected resistors R11 and R12 and a series capacitor C11 are connected across the positive and ground leads LP and LG. The terminal 1 of the integrated circuit IC2 is directly connected to ground lead LG. The terminals 2 and 6 are connected in common and are connected to the junction point formed between resistor R11 and capacitor C11. The terminal 7 is connected to the junction point formed between resistors R11 and R12 while the two terminals 4 and 8 are directly connected to positive lead LP. The terminal 5 is connected to lead LG via capacitor C12 while the terminal 3 is connected to the input of a trigger circuit employing a P-channel field effect transistor (FET) Q11 having a gate electrode g11, a drain electrode d11 and a source electrode s11. As shown, the gate electrode g11 is connected to output terminal 3 of IC2 via resistor R13. The gate electrode g11 is also connected to ground lead LG via resistor R14 while the source electrode is directly coupled to lead LG. The drain electrode d11 is connected to the above-mentioned timing circuit which includes a plurality of series-connected resistors RT1, RT2, RT3 and RT4, a capacitor C13 and a diode D11. As shown, one end of resistor RT1 is connected to lead LP while the other end of resistor RT1 is serially connected to one end of a variable resistor or potentiometer RT2. The other end of potentiometer RT2 is serially connected to one end of resistor RT3 which is paralleled by switch SW1. The other end of resistor RT3 is serially connected to one end of resistor RT4 which is paralleled by switch SW2. The other end of resistor RT4 is connected to the upper plate of timing capacitor C13. The lower plate of capacitor C13 is connected to the cathode electrode of diode D11 while the anode electrode is connected to lead LG. It will be noted that the drain electrode d11 of FET Q11 is connected to the junction point formed between capacitor C13 and resistor RT4 to periodically sample the potential charge on capacitor C13 as will be described in greater detail hereinafter.

The junction point between capacitor C13 and the cathode electrode of diode D11 is connected to the input of an N-channel field effect transistor amplifier Q12 having a gate electrode g12, source electrode s12 and drain electrode d12. The input drain electrode d12 is directly connected to the junction point between capacitor C13 and diode D11 while the drain electrode d12 is directly connected to the high potential lead LD. The source electrode s12 is connected to lead LG via resistor R15. The output from FET Q12 is connected to the input of amplifying transistor Q13 having a base electrode b13, a collector electrode c13 and an emitter electrode e13. The base electrode b13 is connected to source electrode s12 via a coupling capacitor. A reverse bias protection diode D12 is connected between base electrode b13 and ground lead LG. The collector electrode c13 is directly connected to a high positive voltage lead LD. The emitter electrode e13 is coupled to one end of a primary winding P2 of a step-down transformer T2. The other end of primary winding P2 is connected to one end of load resistor R16 and to one end of bypass capacitor C15. The other ends of resistor R16 and capacitor C12 are connected to ground lead LG. The secondary winding S2 of transformer T2 is coupled to a half-wave rectifier including diode D13 and capacitor C16.

As shown, the cathode electrode of rectifier D13 is connected to one end of secondary winding S2 while the other end of winding S2 is connected to lead LG. The anode electrode of rectifier D13 is connected to the upper plate of smoothing capacitor C16.

The rectifier network is connected to a fail-safe amplitude level detector. The vital level detector employs a feedback type of oscillator circuit and a voltage breakdown device.

A current limiting resistor R17 is connected from the junction point common to the diode rectifier D13 and filter capacitor C16 to the anode electrode of a breakdown device, such as, Zener diode Z2. The cathode electrode of Zener diode Z2 is directly connected to ground lead LG. The resistor R17 and Zener diode Z2 form a voltage regulator which stabilizes and provides a substantially constant operating and biasing supply voltage for the oscillator circuit. The oscillator includes a voltage dividing network consisting of series-connected resistors R20, R21 and R22. The resistances of the voltage divider are chosen to provide the proper biasing voltages to the various electrodes of the NPN transistor Q14 which forms the amplifier or active element of a Colpitts oscillator. The oscillating transistor Q14 includes a common emitter electrode e14, an input base electrode b14 and an output collector electrode c14. The frequency determining circuit takes the form of a parallel-tuned or resonant tank circuit which is tuned to a predetermined frequency. The tuned circuit comprises a pair of capacitors C22 and C21 and inductor L2. As shown, the junction point between inductor L2 and capacitor C22 is connected to the collector electrode c14 while the junction point between inductor L2 and capacitor C21 is directly connected to the junction formed between resistors R21 and R22. The remote ends of tuning capacitors C21 and C22 are connected to ground lead LG. The junction between inductor L2 and capacitor C21 is connected to the input base electrode b14 via series-connected capacitor C23 and resistor R23. The junction point between resistor R23 and capacitor C23 is directly connected to the junction point formed between resistors R20 and R21. The emitter electrode e14 is connected through resistor R24 to the negative supply lead LN common to the upper end of resistor 20 and anode electrode of Zener diode Z2. A bypass capacitor C24 is connected in parallel with resistor R24. The collector electrode c14 is connected through coupling capacitor C25 to the input of a multiple stage amplifier and a rectifier.

As shown, the output amplifier includes an input stage having an NPN transistor Q15. The transistor Q15 includes a base electrode b15, a collector electrode c15 and an emitter electrode e15. A voltage divider including a pair of series-connected resistors R25 and R26 is connected between positive lead LP and ground lead LG. The coupling capacitor is coupled to the junction between resistors R25 and R26 and in turn to base electrode b15. The collector electrode c15 is directly coupled to positive lead LP while the emitter electrode e15 is connected by resistor R27 to one end of an electromagnetic relay which will be described hereinafter. The intermediate amplifying stage includes a PNP transistor Q16 having a base electrode b16, a collector electrode c16 and an emitter electrode e16. Th base electrode b16 is directly connected to the emitter electrode e15 while collector electrode c16 is directly connected to ground lead LG. The emitter electrode e16 is connected to the cathode electrode of diode D14. The anode electrode of diode D14 is connected to the lower end of resistor R28 and is connected to positive lead LP. The output stage includes a pair of complementary transistors Q17 and Q18. The NPN transistor Q17 includes a base electrode b17, a collector electrode c17 and an emitter electrode e17 while the PNP transistor Q18 includes a base electrode b18, a collector electrode c18 and an emitter electrode e18. The base electrode b17 is connected to the junction point formed between the resistor R28 and diode 14 while the collector electrode c17 is directly connected to positive lead LP. The base electrode b18 is connected to emitter electrode e16 while the collector electrode c18 is directly connected to ground lead LG. As shown, the emitter electrodes e17 and e18 are connected in common to form the output of the amplifier. The output rectifier takes the form of a voltage doubling network including a pair of capacitors C26 and C27 and a pair of diode rectifiers D15 and D16. It will be noted that the left-hand plate of capacitor 26 is connected to the commonly connected emitter electrodes e17–e18 while the right-hand plate of capacitor 26 is connected to a junction formed between the anode electrode of diode D15 and the cathode electrode of diode D16. The cathode electrode of diode D15 is connected to ground lead LG while the anode electrode of diode D16 is connected to the upper plate of capacitor C27. The lower plate of capacitor C27 is connected to ground lead LG. As shown, the coil CR of a vital type of polar biased electro-magnetic relay is connected to the output of the rectifier network. That is, the right-hand end of relay coil CR is connected to the negative output terminal while the left-hand end of coil CR is connected to ground lead LG so that the relay is only energized when the potential developed across the capacitor 27 is of the polarity shown in FIG. 1B. It will be seen that the fail-safe biased relay includes a pair of silver impregnated carbon front contacts a and b which are closed after a predetermined interval of time. Thus, after the expiration of the time delay period, the relay CR is picked up to close contacts a and b which establish circuit paths to suitable output loads, such as, warning devices or alarms or the like.

Turning now to the operation, it will be assumed that all of the elements or components are intact and functioning properly, that the d.c. voltage source is applied to terminals PT and NT and that the switch SW has just been closed to begin the predetermined time interval or period. The closure of the switch SW results in the application of the d.c. voltage to the series regulator via the LI-C1 filter which suppresses and removes unwanted ripple. The positive d.c. voltage developed across capacitor C1 is regulated by controlling the conduction of the series transistor Q1. The output voltage is sensed and compared by the potentiometer R4 and Zener diode Z to control the conduction of transistors Q2 and Q3 to vary the bias of the series power transistor Q1 to thereby change the voltage drop across transistor Q1 in a direction to compensate for any change in the d.c. output voltage so that the voltage level of the regulator is maintained at a preselected and predetermined value. The output voltage may be varied by moving the tap of potentiometer R4, but once set the regulator maintains a constant voltage output under both input voltage as well as load variations in a well known manner.

The constant d.c. voltage is supplied to the pulse generator and amplifier as well as other portions of the timing circuit via positive lead LP. The application of d.c. operating voltage on integrated circuit IC1 results in the production of symmetrical square-wave output pulses. The pulse duration of the square-wave signals is determined by the values of resistor R5 and capacitor C3, and the square-wave signals appearing on output terminal 10 are amplified by the two-stage amplifier including transistors Q4 and Q5. The amplified square-wave signals are transformer coupled to the dual half-wave rectifier including diodes D3 and Z1 and smoothing capacitors C5 and C6. It will be appreciated that the diode rectifier D3 is forwardly biased and conducts on the positive alternations so that a positive d.c. voltage is developed across capacitor C6 and lead LD becomes positive relative to ground lead LG. Conversely, the Zener diode Z1 conducts in the forward direction during the negative alternations of the square-wave signals and regulates the d.c. output voltage to a value equal to the Zener voltage breakdown level minus the diode drop divided by two, as shown and described in U.S. Pat. No. 3,950,690. Thus, a constant negative d.c. voltage is developed across capacitor C5 and lead LZ becomes negative with respect to ground lead LG. In practice, the voltages of leads LD and LZ are approximately +40v and −40v, respectively, while the voltages on lead LP is approximately +8v. The main and essential purpose of the circuitry including integrated circuit IC1 and transistors Q4 and Q5 is the generation of the positive and negative 40 volt supplies, which are much larger than the input supply voltage. These relatively high voltages are utilized to allow a maximum time which may be up to ten minutes, to be obtained with conventional commercially available capacitors.

As shown, the positive lead LD supplies operation voltage to the amplifier which includes N-channel FET Q12 and NPN transistor Q13 while lead LZ provides a regulated negative potential to a timing circuit as will be described presently. As shown in FIG. 1B, the next proceeding stage of the presently described timing circuit is a pulse generator and timer. As previously mentioned, the pulse generator includes an integrated circuit IC2 which produces output signal pulses having a relatively long ON or positive time and a relatively short OFF time. It will be appreciated that the ON-OFF duration of the pulses produced by IC2 is determined by the RC time constant of the resistances of resistors R11 and R12 and the capacitance of capacitor C11 which may be varied by changing the values of the resistors and the capacitor. The pulses appearing on output terminal 3 are applied to the gate electrode g11 of the switch FET Q11. As previously mentioned, the drain and source electrodes d11-s11 are coupled to the charging capacitor C13 via diode D11. As mentioned above, the charging circuit is supplied with constant negative potential from the regulated half-wave rectifier via negative lead LZ. Thus, a substantially constant current flows through capacitor C13 via resistors RT1, RT2, RT3 and RT4 and diode D11. As the capacitor C13 initially and sequentially continues to charge, the potential level is periodically sampled by the switching FET Q11. It will be seen that the charging rate may be increased or decreased by closing or opening shunting switches SW1 or SW2 and by moving the tap on potentiometer R12. It will be appreciated that in order not to deplete any appreciable charge from capacitor C13, it is desirable to sample the potential charge as quickly as possible. The sampling action is achieved by momentarily turning on the FET Q11 so that a short pulse is conveyed to gate electrode g12 of N-channel FET Q12. In practice, the long ON times of the pulses generated by IC2 may be considered as high while the short OFF times of the pulses may be considered as low so that the FET Q11 is rendered conductive only for a relatively short period of time.

An important aspect of the subject invention is that transistor Q11 is a type of FET that is conductive when its gate is low or zero volts. Thus, when all input power is removed from input terminals PT and NT, the timing capacitor C13 is discharged through FET Q11 thereby safely guaranteeing its discharge as is required. When the FET Q11 is momentarily rendered conductive, a circuit path is established through the drain and source electrodes d11-s11 so that the top of the negatively charged plate of capacitor C13 is driven toward zero volts thereby driving the bottom plate of capacitor C13 positively so that a narrow positive pulse is applied to gate electrode g12. It will be understood that the width of the pulse appearing on gate g12 corresponds to the OFF duration of the pulses generated by IC2, and the amplitude of the pulse corresponds to the potential charge that is on the capacitor C13 at the moment of sampling. Thus, the source follower FET Q12 is rendered conductive and produces a pulse on source electrode s12 which is applied to the base electrode b13 via coupling capacitor 14. Ergo, the emitter follower transistor Q13 produces a pulse in the primary winding P2 which induces a signal into secondary winding S2. The step-down transformer T2 is used to reduce the high voltage pulses down to a lower voltage level which is suitable for the subsequent circuits. This is a safe manner of ensuring against a possible false increase in voltage. The signal is rectified by diode D13, and a d.c. voltage proportional to the amplitude of the signal is developed across capacitor C13. The d.c. voltage is measured by the level detector, namely, Zener diode Z2. If the d.c. voltage developed across capacitor C16 is less than the breakdown voltage of the Zener diode Z2, the oscillator of the level detector remains dormant and no oscillations are produced by transistor Q14. The periodic sampling of the potential charge on timing capacitor C13 will continue, and the quiescent condition of the oscillating transistor Q14 will remain as long as the potential charge across capacitor C16 does not exceed the breakdown voltage of Zener diode Z2. A predetermined time after the closing of the switch SW, the charge on capacitor 13 reaches a sufficient level to cause the rectified signal pulses to cause the d.c. voltage on capacitor C16 to exceed the breakdown or avalanche voltage of Zener diode Z2. When the Zener diode Z2 breaks down and conducts, operating supply voltage is furnished to the oscillating circuit of the level detector. In addition, with the Zener diode conducting, a low impedance path is established for the tank circuit so that sufficient regenerative feedback is now provided for the transistor oscillator wherein oscillations occur and a.c. output signals are developed on collector electrode c14. The a.c. signals are amplified by the three-stage amplifier including transistors Q15, Q16, Q17 and Q18 so that amplified a.c. signals are developed on emitter electrodes e17-e18. The amplified a.c. signals are rectified by the voltage doubling circuit including diode rectifiers D15-D16 and capacitors C26-C27. Thus, a d.c. voltage having a polarity as shown in FIG. 1B is developed across capacitor C27 which causes the energization of the coil of the vital relay CR and results in the picking up and closure of contacts a and b. Thus, the polar biased relay CR is energized a preselected or predetermined time after the closure of the switch SW.

As previously mentioned, the presently described timing circuit operates in a fail-safe manner in that no critical component or circuit failure is capable of causing the predetermined time period to become shorter than that which is initially selected by the setting of switches SW1-SW2 and the tap of potentiometer RT2. It will be seen that the polar bias relay CR requires that the upper plate of the capacitor has a negative polarity relative to ground so that a short to supply lead LP will not result in the energization of the relay CR. Thus, this polarity reversal provides protection against shorts to the power supply. Further, the periodic sampling or chopping effect ensures that transients or surge voltages cannot result in the premature picking up of the relay CR. In addition, the Zener diode Z1 ensures that the negative supply voltage on lead LZ will not unsafely increase so that the charging rate of capacitor C13 is guaranteed. Further, the polarities of the sampling circuit have been designed to ensure that no failure can result in the increase of charging current to capacitor C13. Additionally, the circuit and leads have beeen meticulously layed out to ensure that adjacent conductors cannot touch or become short circuited.

Thus, it can be seen that under no circumstance can the vital output relay be prematurely picked up prior to the expiration of the predetermined time period.

It will also be appreciated that, while this invention finds particular utility in vehicle control systems, it is readily understood that the presently described time element relay circuit may be employed in other systems and apparatus which require the security and safety that is inherently present in the subject invention. Further, it is understood that regardless of the manner in which the invention is used, it is apparent that various alterations, modifications and changes may be made by persons skilled in the art without departing from the spirit and scope of this invention. Thus, it will be evident that all changes, equivalents, and variations falling within the bounds of the present invention are herein meant to be included in the appended claims.

Having now described the invention, what we claim as new and desire to secure by Letters Patent, is:

1. A fail-safe time element relay comprising, a switching means selectively connecting a source of d.c. voltage to a voltage regulating means, said voltage regulating means supplying regulated voltage to a signal generating means, said signal generating means producing a.c. signals which are fed to an amplifying means, said amplifying means supplying amplified a.c. signals to a rectifying means, said rectifying means rectifying said amplified a.c. signals into a first and a second d.c. voltage, a pulse generating means for supplying signal pulses to a triggering means, said first d.c. voltage which is safe against increasing connected to a timing circuit means for storing a charge, said second d.c. voltage supplying operating potential to an amplifier, said triggering means sampling the amount of stored charge, in a manner which is safe against any failure causing an increase in the charge and which safely removes the charge upon the removal of the source of d.c. voltage, and causing said amplifier to produce amplified pulses, a rectifier for rectifying said amplifier pulses and causing an oscillating level detecting means to produce a.c. oscillations when the amplified rectified pulses reach a predetermined level, an output amplifying means for amplifying said a.c. oscillations, a voltage doubler for rectifying said amplified a.c. oscillations and for energizing an output device a predetermined time after said switching means connects said voltage regulating means to the source of d.c. voltage.

2. The fail-safe time element relay as defined in claim 1, wherein said switching means includes an ON-OFF contact device.

3. The fail-safe time element relay as defined in claim 1, wherein said regulating means is a transistorized series regulator.

4. The fail-safe time element relay as defined in claim 1, said signal generating means includes an integrated circuit for generating square-wave signals.

5. The fail-safe time element relay as defined in claim 1, wherein said rectifying means includes a Zener diode for regulating said first d.c. voltage.

6. The fail-safe time element relay as defined in claim 1, wherein said pulse generating means includes an integrated circuit for producing signal pulses having an unequal duty cycle.

7. The fail-safe time element relay as defined in claim 1, wherein timing circuit means includes series resistors and a capacitor.

8. The fail-safe time element relay as defined in claim 1, wherein said triggering means includes a P-channel field effect transistor which has the source and drain electrodes connected to said timing circuit means.

9. The fail-safe time element relay as defined in claim 1, wherein said oscillating level detecting means includes a Zener diode and a transistor oscillator.

10. The fail-safe time element relay as defined in claim 1, wherein said output device is a vital electromagnetic relay.

11. A fail-safe timing circuit comprising, a switch, a regulator for producing a source of regulated d.c. voltage when the switch is closed, a signal generator powered by said regulated d.c. voltage source for producing a.c. signals which are amplified and are fed to a rectifier which provides a first polarity of safely regulated d.c. voltage and a second polarity of unregulated d.c. voltage, a pulse generator powered by said regulated d.c. voltage source for producing signal pulses having an unequal duty cycle, a charging circuit coupled to said first polarity of safely regulated d.c. voltage being periodically sampled by a trigger circuit, an amplifier circuit coupled to said charging circuit for amplifying periodic pulses which are produced during the sampling of said charging circuit, a rectifier for rectifying the periodic pulses, a level detector for producing a.c. oscillations when the level of the rectified periodic pulses exceeds a predetermined value, an amplifier for amplifying the a.c. oscillations, and a rectifier for rectifying the amplified a.c. oscillations to produce a d.c. output voltage for energizing a relay upon expiration of a given time interval after said switch is closed.

12. The fail-safe timing circuit as defined in claim 11, wherein said amplifier for amplifying the periodic pulses includes an N-channel field effect transistor stage and an NPN transistor stage transformer coupled to said rectifier which rectifies the periodic pulses.

13. The fail-safe timing circuit as defined in claim 11, wherein said amplifier for amplifying the a.c. oscillations includes an initial NPN transistor stage, an intermediate PNP transistor stage and a final complementary transistor stage.

14. The fail-safe timing circuit as defined in claim 11, wherein said rectifier for rectifying the amplified a.c. oscillations includes a pair of diodes and a pair of capacitors forming a voltage doubling network.

15. The fail-safe timing circuit as defined in claim 11, wherein said trigger and amplifier circuit being arranged such that no leakage, shorting, opening and any other probable failure of any component can falsely simulate the time constant of the charging circuit and cannot result in failure to reset the charging circuit upon removal of input power.

* * * * *